United States Patent
Hinks et al.

(10) Patent No.: US 12,405,337 B2
(45) Date of Patent: Sep. 2, 2025

(54) SYSTEM AND METHOD FOR MEASURING EDDY CURRENTS WITH LONG TIME CONSTANTS USING A PSEUDO-CONTINUOUS ACQUISITION

(71) Applicant: GE Precision Healthcare LLC, Waukesha, WI (US)

(72) Inventors: Richard Scott Hinks, Sandia Park, NM (US); Andreas Ebel, Waukesha, WI (US); Hua Li, Sussex, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 215 days.

(21) Appl. No.: 18/481,356

(22) Filed: Oct. 5, 2023

(65) Prior Publication Data

US 2025/0116743 A1 Apr. 10, 2025

(51) Int. Cl.
*G01R 33/58* (2006.01)
*G01R 33/48* (2006.01)
*G01R 33/561* (2006.01)
*G01R 33/565* (2006.01)

(52) U.S. Cl.
CPC ......... *G01R 33/58* (2013.01); *G01R 33/4818* (2013.01); *G01R 33/5615* (2013.01); *G01R 33/56518* (2013.01)

(58) Field of Classification Search
CPC .............. G01R 33/58; G01R 33/56518; G01R 33/4818; G01R 33/5615
USPC ....................................................... 324/309
See application file for complete search history.

(56) References Cited

U.S. PATENT DOCUMENTS

| | | | |
|---|---|---|---|
| 4,698,591 A | 10/1987 | Glover et al. | |
| 4,978,919 A | 12/1990 | Hinks | |
| 5,770,943 A * | 6/1998 | Zhou ................ | G01R 33/56518 324/307 |
| 6,127,826 A * | 10/2000 | Thompson ....... | G01R 33/56554 324/309 |

(Continued)

FOREIGN PATENT DOCUMENTS

CN 115877295 3/2023

OTHER PUBLICATIONS

Schiff et al., "New Efficient Eddy-Field-Mapping Procedure (FAME)", Journal of Magnetic Resonance, Series B 104, 1994, Academic Press, Inc., 4 pgs.

*Primary Examiner* — Roberto Velez
(74) *Attorney, Agent, or Firm* — Fletcher Yoder, P.C.

(57) ABSTRACT

A system and a method for measuring eddy currents with long time constants includes initiating, via a processor, a calibration scan of a phantom utilizing a magnetic resonance imaging (MRI) scanner. The system and the method also include utilizing, via the processor, a train of gradient echo sequences to simultaneously generate and measure the eddy currents during the calibration scan. Both eddy current generation and measurement are completed within each gradient echo sequence of the train of gradient echo sequences. The system and the method further include acquiring, via the processor, k-space data from the train of gradient echo sequences. The system and the method still further include converting, via the processor, the k-space data to eddy current gradient fields. The system and the method even further include estimating, via the processor, the eddy currents as a function of time based on the eddy current gradient fields.

20 Claims, 8 Drawing Sheets

(56) References Cited

U.S. PATENT DOCUMENTS

| | | |
|---|---|---|
| 6,335,620 B1 | 1/2002 | Weissenberger |
| 6,448,773 B1 | 9/2002 | Xhang |
| 7,323,872 B1 * | 1/2008 | Takahashi .............. G01R 33/58 |
| | | 324/309 |
| 9,188,656 B2 | 11/2015 | Yui et al. |
| 9,709,653 B2 | 7/2017 | Wheaton et al. |
| 2020/0116807 A1 * | 4/2020 | Hölscher .............. G01R 33/446 |

* cited by examiner

SYSTEM AND METHOD FOR MEASURING EDDY CURRENTS WITH LONG TIME CONSTANTS USING A PSEUDO-CONTINUOUS ACQUISITION

BACKGROUND

The subject matter disclosed herein relates to medical imaging and, more particularly, to a system and a method for measuring eddy currents with long time constants using a pseudo-continuous acquisition.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

In MRI, eddy currents are un-wanted electrical currents generated in metallic structures within the MRI system when the gradient field changes. The magnetic fields associated with eddy currents distort the ideal gradient waveforms and cause artifacts in MRI images. The eddy currents can commonly be characterized by a number of exponential terms and oscillatory terms. Exponential terms are the dominant terms. During installation of an MRI system, eddy currents are measured (e.g., during system calibration). Usually an MRI sequence (e.g., setting of pulse sequences and pulsed field gradients) for measuring eddy currents involve two main steps. The first main step includes initiating the eddy current fields by applying an excitation gradient pulse. The second main step includes utilizing multiple RF pulses to measure the time-dependent eddy current fields. However, this approach has limitations. Typically, the duration of the excitation gradient is much longer than the eddy current time constant (e.g., with durations of approximately 45 seconds for very long time constants (e.g., in the order of 10 seconds)). This prolonged gradient duration leads to inefficiency in data collection since no data is acquired during the excitation gradient pulse. Additionally, the extended gradient duration introduces vulnerability to magnet drift effects such as movement of metal (e.g., due to ferromagnetic material in the local area) or $B_0$ drift of the main magnetic field.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for measuring eddy currents with long time constants is provided. The computer-implemented method includes initiating, via a processor, a calibration scan of a phantom utilizing a magnetic resonance imaging (MRI) scanner. The computer-implemented method also includes utilizing, via the processor, a train of gradient echo sequences to simultaneously generate and measure the eddy currents during the calibration scan, wherein both eddy current generation and measurement are completed within each gradient echo sequence. The computer-implemented method further includes acquiring, via the processor, k-space data from the train of gradient echo sequences. The computer-implemented method still further includes converting, via the processor, the k-space data to eddy current gradient fields. The computer-implemented method even further includes estimating, via the processor, the eddy currents as a function of time based on the eddy current gradient fields.

In another embodiment, a system for measuring eddy currents with long time constants is provided. The system includes a memory encoding processor-executable routines. The system also includes a processor configured to access the memory and to execute the processor-executable routines, wherein the processor-executable routines, when executed by the processor, cause the processor to perform actions. The actions include initiating a calibration scan of a phantom utilizing a magnetic resonance imaging (MRI) scanner. The actions also include utilizing a train of gradient echo sequences to simultaneously generate and measure the eddy currents during the calibration scan, wherein both eddy current generation and measurement are completed within each gradient echo sequence of the train of gradient echo sequences. The actions further include acquiring k-space data from the train of gradient echo sequences. The actions still further include converting the k-space data to eddy current gradient fields. The actions even further include estimating the eddy currents as a function of time based on the eddy current gradient fields.

In a further embodiment, a non-transitory computer-readable medium, the non-transitory computer-readable medium including processor-executable code that when executed by a processor, causes the processor to perform actions. The actions include initiating a calibration scan of a phantom utilizing a magnetic resonance imaging (MRI) scanner. The actions also include utilizing a train of gradient echo sequences to simultaneously generate and measure the eddy currents during the calibration scan, wherein both eddy current generation and measurement are completed within each gradient echo sequence of the train of gradient echo sequences. The actions further include acquiring k-space data from the train of gradient echo sequences. The actions still further include converting the k-space data to eddy current gradient fields. The actions even further include estimating the eddy currents as a function of time based on the eddy current gradient fields.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
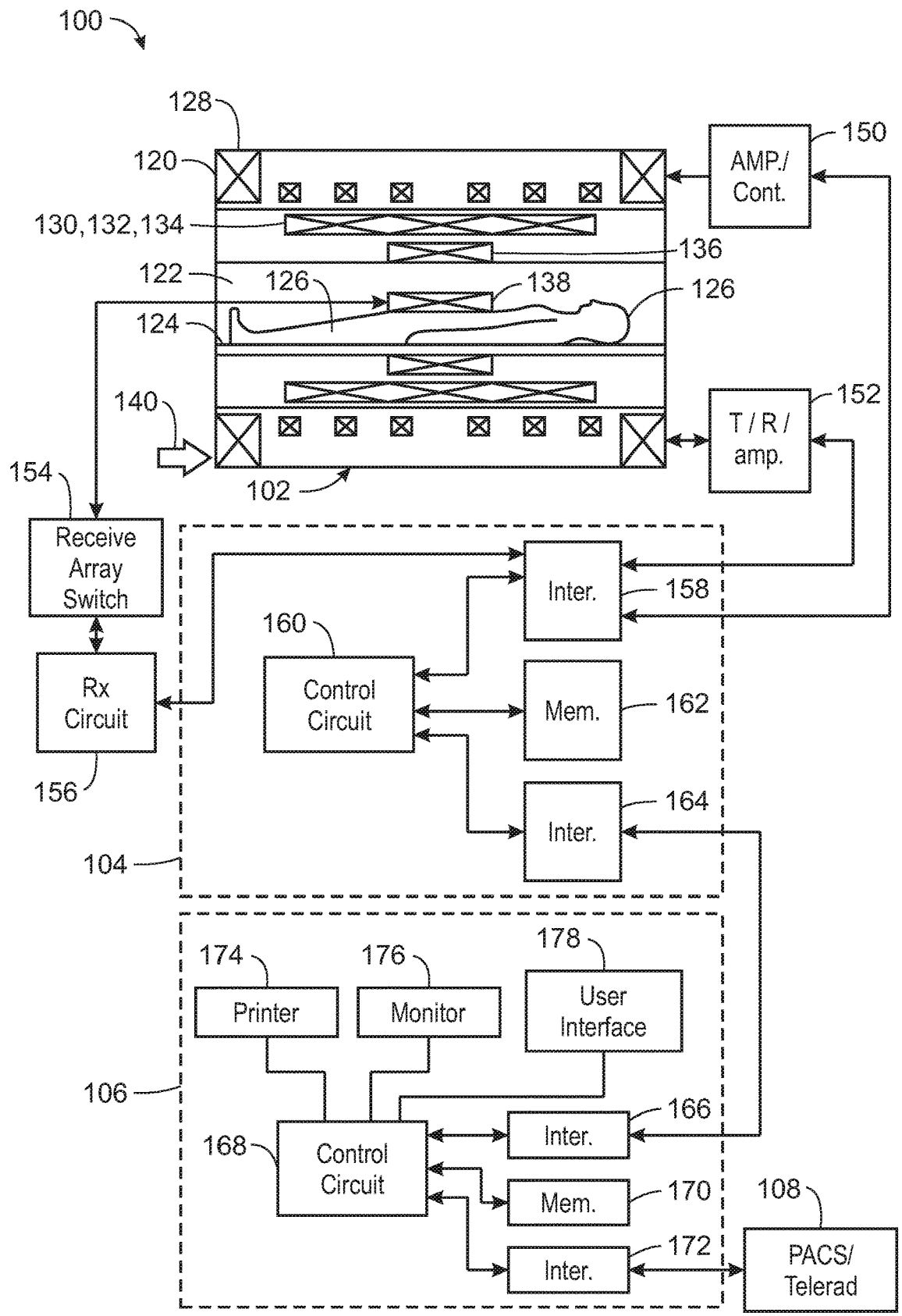
FIG. 1 illustrates a schematic diagram of an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The present disclosure provides systems and methods for measuring eddy currents with long time constants. In particular, the systems and methods are configured to utilize a gradient echo sequence to measure the eddy currents with the long time constants. The disclosed embodiments include initiating a calibration scan of a phantom utilizing a magnetic resonance imaging (MRI) scanner. The disclosed embodiments also include utilizing a train of gradient echo sequences to simultaneously generate and measure the eddy currents during the calibration scan. In the context of this description, the term simultaneously indicates that both eddy current generation and measurement are completed within each gradient echo sequence of the train of gradient echo sequences. The disclosed embodiments further include acquiring k-space data from the train of gradient echo sequences. The disclosed embodiments still further include converting the k-space data to eddy current gradient fields. The disclosed embodiments even further include estimating the eddy currents as a function of time based on the eddy current gradient fields.

In certain embodiments, the estimated eddy currents have a time constant at least two times longer than a repetition time of each gradient echo sequence of the train of gradient echo sequences. In certain embodiments, the induced eddy current can be approximated as resulting from a constant gradient with a duration equal to the time repetition and an amplitude equivalent to an average gradient, wherein the average gradient is a total gradient area of a respective gradient echo sequence of the train of gradient echo sequences divided by the time repetition. In certain embodiments, estimating the eddy currents as a function of time includes scaling the eddy current gradient fields by an average gradient strength and fitting the scaled eddy current gradient fields as a function of time. In certain embodiments, estimating the eddy currents as a function of time includes utilizing Equation 1 described below.

In certain embodiments, a first portion of each gradient echo sequence of the train of gradient echo sequences includes a balanced gradient echo (e.g., with a zero gradient area) for eddy current measurement, wherein the balanced gradient echo has a balanced readout gradient and slice gradient to avoid inducing additional eddy current effects (e.g., from the readout gradient and the slice gradient). In certain embodiments, a second portion of a set of gradient echo sequences of the train of gradient echo sequences includes an eddy current excitation gradient (or eddy current generating gradient) for eddy current generation. In certain embodiments, the second portion of some gradient echo sequences of the set of gradient echo sequences includes a negative eddy current excitation gradient and the second portion of some gradient echo sequences of the set of gradient echo sequences includes a positive eddy current excitation gradient. The utilization of the bipolar (i.e., positive and negative) eddy current excitation gradients enables eddy currents to be distinguished from $B_0$ drift since eddy currents change direction in response to the bipolar eddy current excitation gradients and generally $B_0$ drift does not.

The disclosed embodiments enable the simultaneous generation and measurement of eddy currents. This enables a pseudo-continuous scan (with the train of GRE sequences intermittently repeated) to be utilized to measure eddy currents with long time constants that takes less time and is more efficient than previous techniques. In addition, the disclosed embodiments are less sensitive to magnetic drift. The disclosed embodiments also improve the accuracy of calibration for eddy currents with very long time constants. By increasing the accuracy of the calibration, image quality is improved in certain MR images.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging a selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

In certain embodiments, the programming code is configured to measuring eddy currents with long time constant. In particular, the programming code is configured to utilize an MRI sequence such as a gradient echo sequence to measure the eddy currents with the long time constant. The programming code is configured to initiate a calibration scan of a phantom utilizing an MRI scanner. The programming code is also configured to utilize a train of gradient echo sequences to repeatedly generate and measure the eddy currents in an interleaved fashion during the calibration scan. The programming code is further configured to acquire k-space data from the train of gradient echo sequences. The programming code is still further configured to convert the k-space data to eddy current gradient fields. The programming code is yet further configured to estimate the eddy currents as a function of time based on the eddy current gradient fields.

In certain embodiments, the estimated eddy currents have a time constant at least two times longer than a time repetition of each gradient echo sequence of the train of gradient echo sequences. In certain embodiments, the induced eddy current can be approximated as resulting from a constant gradient with a duration equal to the time repetition and an amplitude equivalent to an average gradient, wherein the average gradient is a total gradient area of a respective gradient echo sequence of the train of gradient echo sequences divided by the time repetition. In certain embodiments, the programming code is configured to estimate the eddy currents as a function of time by scaling the eddy current gradient fields by an average gradient strength and fitting the scaled eddy current gradient fields as a function of time. In certain embodiments, the programming code is configured to estimate the eddy currents as a function of time includes utilizing Equation 1 described below.

In certain embodiments, a first portion of each gradient echo sequence of the train of gradient echo sequences includes a balanced gradient echo (e.g., with a zero gradient area) for eddy current measurement, wherein the balanced gradient echo has a balanced readout gradient and slice gradient to avoid eddy current effect (e.g., from the readout gradient and the slice gradient). In certain embodiments, a second portion of a set of gradient echo sequences of the train of gradient echo sequences includes an eddy current excitation gradient (or eddy current generating gradient) for eddy current generation. In certain embodiments, the second portion of some gradient echo sequences of the set of gradient echo sequences includes a negative eddy current excitation gradient and the second portion of some gradient echo sequences of the set of gradient echo sequences includes a positive eddy current excitation gradient. The utilization of the bipolar (i.e., positive and negative) eddy current excitation gradients enables eddy currents to be distinguished from $B_0$ drift since eddy currents change direction in response to the bipolar eddy current excitation gradients and $B_0$ drift does not.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
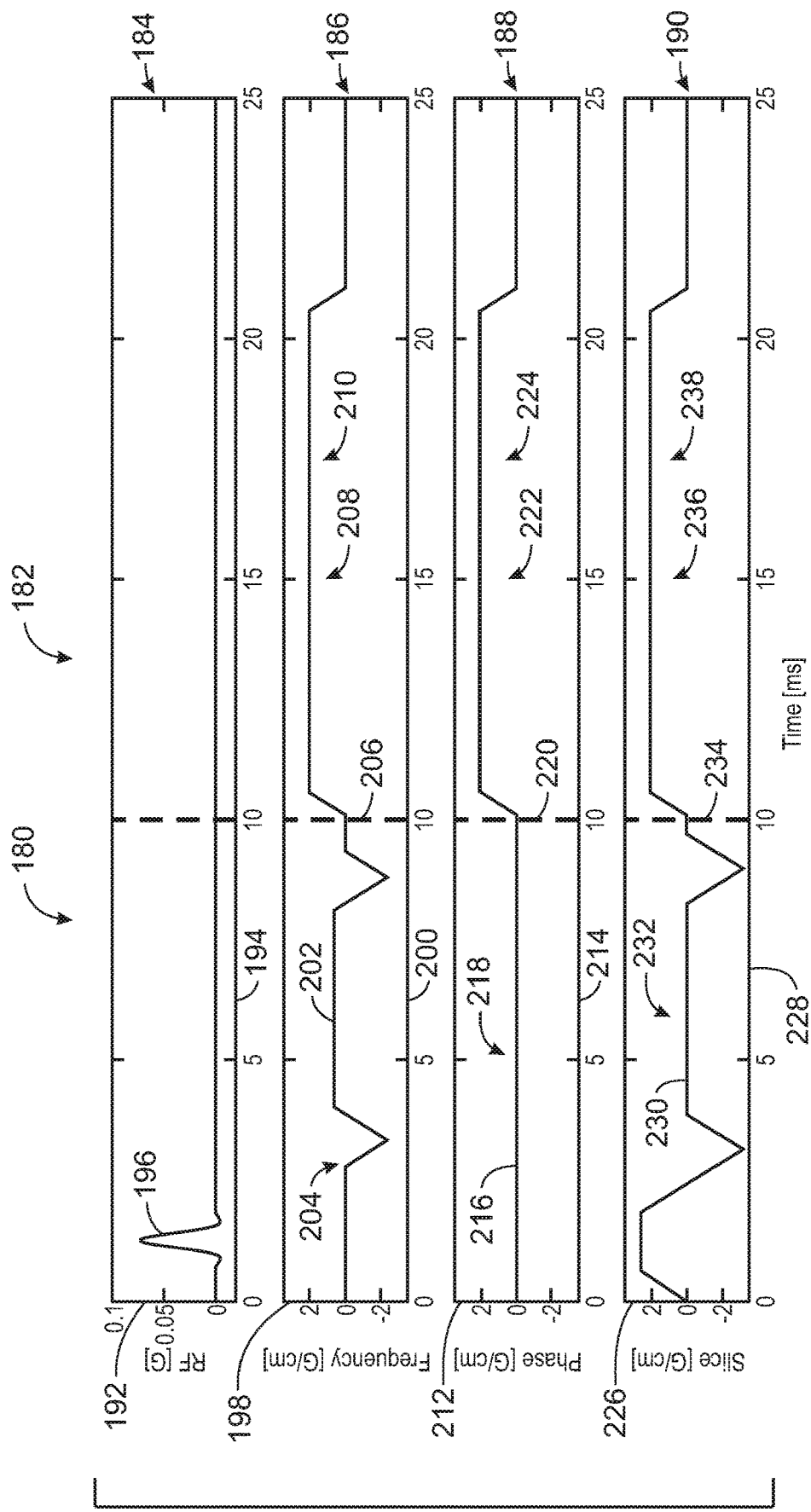
FIG. 2 illustrates a pulse sequence diagram for a gradient echo sequence utilized to measure eddy currents with long time constants (e.g., having eddy current excitation gradients with positive polarity), in accordance with aspects of the present disclosure.

FIG. 2 illustrates a pulse sequence diagram 180 for a gradient echo sequence 182 utilized to measure eddy currents with long time constants (e.g., having eddy current excitation gradients with positive polarity). As described in greater detail below, the gradient echo sequence 182 is utilized as part of a train of the gradient echo sequences utilized to measure eddy currents with long time constants (e.g., wherein the estimated or measured eddy currents have a time constant at least two times longer than a time repetition of each gradient echo sequence of the train of gradient echo sequences). The gradient echo sequence 182 is configured to enable simultaneous generation and measurement of eddy currents (e.g., during a calibration scan such as an eddy current calibration scan).

The four rows 184, 186, 188, and 190 illustrate the gradient echo sequence 182 utilized to measure eddy currents with long time constants. The first row 184 (e.g. top row) of the pulse sequence diagram 180 illustrates RF (represented along Y-axis 192) over time (represented along X-axis 194). As depicted, an RF pulse 196 is generated at approximately 1 millisecond. The second row 186 of the pulse sequence diagram 180 illustrates a gradient (represented along Y-axis 198 as gradient strength) applied along a frequency direction over time (represented along X-axis 200). The gradient applied along the frequency direction is represented by plot 202. A first portion 204 of the plot 202 located to the left of dashed line 206 is a balanced gradient echo having a zero gradient area. A second portion 208 of the plot 202 located to the right of the dashed line 206 has an eddy current excitation gradient or eddy current generating gradient 210 having a positive polarity.

The third row 188 of the pulse sequence diagram 180 illustrates a gradient (represented along Y-axis 212 as gradient strength) applied along a phase direction over time (represented along X-axis 214). The gradient applied along the phase direction is represented by plot 216. A first portion 218 of the plot 216 located to the left of dashed line 220 is a balanced gradient echo having a zero gradient area. A second portion 222 of the plot 216 located to the right of the dashed line 222 has an eddy current excitation gradient or eddy current generating gradient 224 having a positive polarity.

The fourth row 190 (e.g., bottom row) of the pulse sequence diagram 180 illustrates a gradient (represented along Y-axis 226 as gradient strength) applied along a slice direction over time (represented along X-axis 228). The gradient applied along the slice direction is represented by plot 230. A first portion 232 of the plot 230 located to the left of dashed line 234 is a balanced gradient echo having a zero gradient area. A second portion 236 of the plot 230 located to the right of the dashed line 234 has an eddy current excitation gradient or eddy current generating gradient 238 having a positive polarity.

The balanced gradient echo of the first portions 204, 216, 232 of the applied gradients are utilized for eddy current measurement. The first portions 204 and 232 of the frequency gradient (e.g., readout gradient) and the slice gradient, respectively, are balanced to avoid eddy current effects from the frequency gradient and the slice gradient. The eddy current excitation gradients 210, 224, and 238 of the second portions 208, 222, and 236 are utilized for eddy current generation. The eddy current excitation gradients may be played along a single gradient axis at a time. When the eddy current excitation gradient is on the same axis with the readout gradient, the measured eddy current is commonly called on-axis eddy current. When the eddy current excitation gradient is not on the same axis with the readout gradient, the measured eddy current is commonly called cross-term eddy current. It is also possible to play one excitation gradient and do measurements along three axes sequentially so that both on-axis and cross-term eddy currents are measured in a single scan. The eddy current excitation gradients 210, 224, and 238 having positive polarity are utilized in conjunction with a gradient echo sequence (described in FIG. 3) that includes eddy current excitation gradients having a negative polarity to form bipolar eddy current excitation gradients. These bipolar eddy current excitation gradients enable eddy currents to be distinguished from $B_0$ drift since eddy currents change direction in response to the bipolar eddy current excitation gradients and $B_0$ drift does not. The gradient echo sequence 182 is utilized in conjunction with a gradient echo sequence (described in FIG. 3) to form a train of GRE sequences that are intermittently repeated (e.g., every 100 milliseconds (ms)) (e.g., as part of a pseudo-continuous scan) to measure eddy currents. The train of GRE sequences are utilized in conjunction with a GRE sequence (described in FIG. 4) lacking eddy current excitation gradients.

Figure 3:
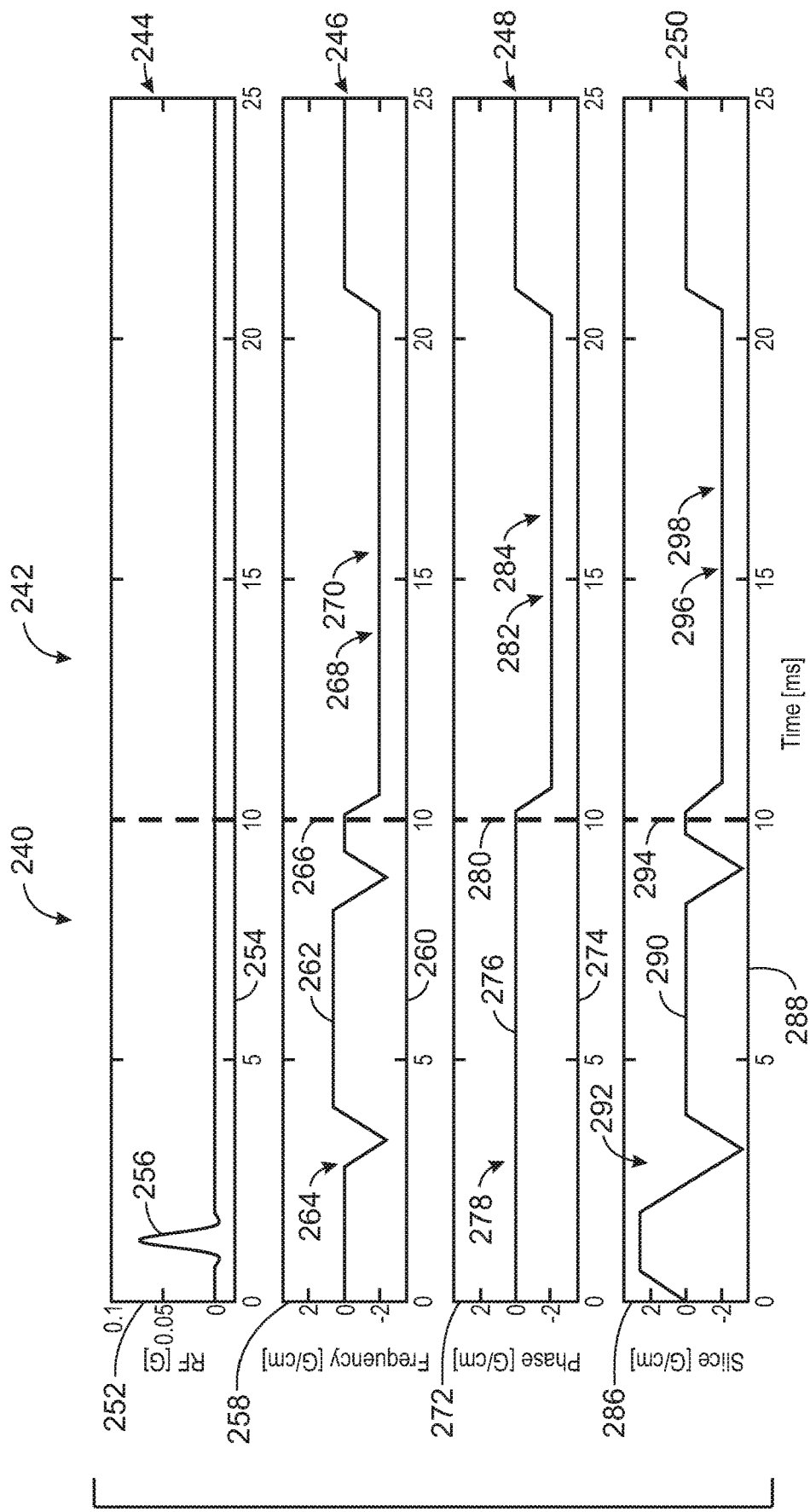
FIG. 3 illustrates a pulse sequence diagram for a gradient echo sequence utilized to measure eddy currents with long time constants (e.g., having eddy current excitation gradients with negative polarity), in accordance with aspects of the present disclosure.

FIG. 3 illustrates a pulse sequence diagram 240 for a gradient echo sequence 242 utilized to measure eddy currents with long time constants (e.g., having eddy current excitation gradients with negative polarity). As described in greater detail below, the gradient echo sequence 242 is utilized as part of a train of the gradient echo sequences utilized to measure eddy currents with long time constants (e.g., wherein the estimated or measured eddy currents have a time constant at least two times longer than a time repetition of each gradient echo sequence of the train of gradient echo sequences). The gradient echo sequence 242 is configured to enable simultaneous generation and measurement of eddy currents (e.g., during a calibration scan such as an eddy current calibration scan).

The four rows 244, 246, 248, and 250 illustrate the gradient echo sequence 242 utilized to measure eddy currents with long time constants. The first row 244 (e.g. top row) of the pulse sequence diagram 240 illustrates RF (represented along Y-axis 252) over time (represented along X-axis 254). As depicted, an RF pulse 256 is generated at approximately 1 millisecond. The second row 246 of the pulse sequence diagram 240 illustrates a gradient (represented along Y-axis 258 as gradient strength) applied along a frequency direction over time (represented along X-axis 260). The gradient applied along the frequency direction is represented by plot 262. A first portion 264 of the plot 262 located to the left of dashed line 266 is a balanced gradient echo having a zero gradient area. A second portion 268 of the plot 262 located to the right of the dashed line 266 has an eddy current excitation gradient or eddy current generating gradient 270 having a negative polarity.

The third row 248 of the pulse sequence diagram 240 illustrates a gradient (represented along Y-axis 272 as gradient strength) applied along a phase direction over time (represented along X-axis 274). The gradient applied along the phase direction is represented by plot 276. A first portion 278 of the plot 276 located to the left of dashed line 280 is a balanced gradient echo having a zero gradient area. A second portion 282 of the plot 276 located to the right of the dashed line 280 has an eddy current excitation gradient or eddy current generating gradient 284 having a negative polarity.

The fourth row 250 (e.g., bottom row) of the pulse sequence diagram 240 illustrates a gradient (represented along Y-axis 286 as gradient strength) applied along a slice direction over time (represented along X-axis 288). The gradient applied along the slice direction is represented by plot 290. A first portion 292 of the plot 290 located to the left of dashed line 294 is a balanced gradient echo having a zero gradient area. A second portion 296 of the plot 290 located to the right of the dashed line 294 has an eddy current excitation gradient or eddy current generating gradient 296 having a negative polarity.

The balanced gradient echo of the first portions 264, 278, 292 of the applied gradients are utilized for eddy current measurement. The first portions 264 and 292 of the frequency gradient (e.g., readout gradient) and the slice gradient, respectively, are balanced to avoid eddy current effects from the frequency gradient and the slice gradient. The eddy current excitation gradients 270, 284, and 298 of the second portions 268, 282, and 296 are utilized for eddy current generation. The eddy current excitation gradients 270, 284, and 298 having negative polarity are utilized in conjunction with a gradient echo sequence (described in FIG. 2) that includes eddy current excitation gradients having a positive polarity to form bipolar eddy current excitation gradients. These bipolar eddy current excitation gradients enable eddy currents to be distinguished from $B_0$ drift since eddy currents change direction in response to the bipolar eddy current excitation gradients and $B_0$ drift does not. The gradient echo sequence 242 is utilized in conjunction with a gradient echo sequence (described in FIG. 2) to form a train of GRE sequences that are intermittently repeated (e.g., every 100 milliseconds (ms)) (e.g., as part of a pseudo-continuous scan) to measure eddy currents. The train of GRE sequences are utilized in conjunction with a GRE sequence (described in FIG. 4) lacking eddy current excitation gradients.

Figure 4:
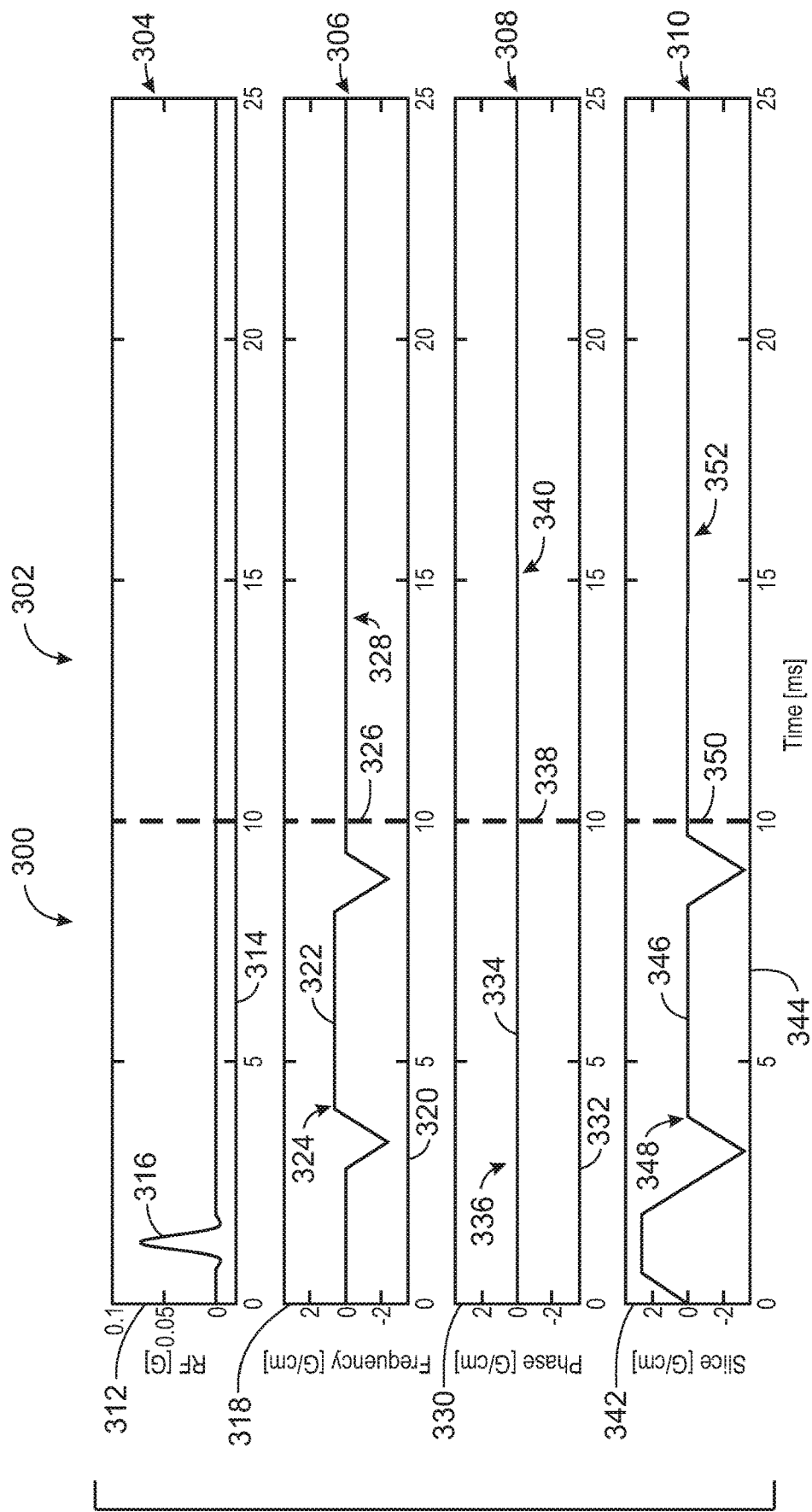
FIG. 4 illustrates a pulse sequence diagram for a gradient echo sequence utilized to measure eddy currents with long time constants (e.g., lacking eddy current excitation gradients), in accordance with aspects of the present disclosure.

FIG. 4 illustrates a pulse sequence diagram 300 for a gradient echo sequence 302 utilized to measure eddy currents with long time constants (e.g., lacking eddy current excitation gradients). As described in greater detail below, the gradient echo sequence 302 is utilized in conjunction with a train of the gradient echo sequences (those described in FIGS. 2 and 3) to measure eddy currents with long time constants (e.g., wherein the estimated or measured eddy currents have a time constant at least two times longer than a time repetition of each gradient echo sequence of the train of gradient echo sequences). The gradient echo sequence 302 is configured removing background fields for measurement of eddy currents (e.g., during a calibration scan such as an eddy current calibration scan).

The four rows 304, 306, 308, and 310 illustrate the gradient echo sequence 302 utilized to measure eddy currents with long time constants. The first row 304 (e.g. top row) of the pulse sequence diagram 300 illustrates RF (represented along Y-axis 312) over time (represented along X-axis 314). As depicted, an RF pulse 316 is generated at approximately 1 millisecond. The second row 306 of the pulse sequence diagram 302 illustrates a gradient (represented along Y-axis 318 as gradient strength) applied along a frequency direction over time (represented along X-axis 320). The gradient applied along the frequency direction is represented by plot 322. A first portion 324 of the plot 322 located to the left of dashed line 326 is a balanced gradient echo having a zero gradient area. A second portion 328 of the plot 322 located to the right of the dashed line 326 lacks an eddy current excitation gradient or eddy current generating gradient.

The third row 308 of the pulse sequence diagram 300 illustrates a gradient (represented along Y-axis 330 as gradient strength) applied along a phase direction over time (represented along X-axis 332). The gradient applied along the phase direction is represented by plot 334. A first portion 336 of the plot 334 located to the left of dashed line 338 is a balanced gradient echo having a zero gradient area. A second portion 340 of the plot 334 located to the right of the dashed line 338 lacks an eddy current excitation gradient or eddy current generating gradient.

The fourth row 310 (e.g., bottom row) of the pulse sequence diagram 300 illustrates a gradient (represented along Y-axis 342 as gradient strength) applied along a slice direction over time (represented along X-axis 344). The gradient applied along the slice direction is represented by plot 346. A first portion 348 of the plot 346 located to the left of dashed line 350 is a balanced gradient echo having a zero gradient area. A second portion 352 of the plot 346 located to the right of the dashed line 350 lacks an eddy current excitation gradient or eddy current generating gradient.

The balanced gradient echo of the first portions 324, 336, 348 of the applied gradients are utilized for eddy current measurement. The first portions 324 and 348 of the frequency gradient (e.g., readout gradient) and the slice gradient, respectively, are balanced to avoid eddy current effects from the frequency gradient and the slice gradient. The lack of eddy current excitation gradients in the second portions 328, 340, and 352 enable the removal of background fields. The gradient echo sequence 302 is utilized in conjunction with a train of GRE sequences (as described in FIGS. 2 and 3) that are intermittently repeated (e.g., every 100 milliseconds (ms)) (e.g., as part of a pseudo-continuous scan) to measure eddy currents.

Figure 5:
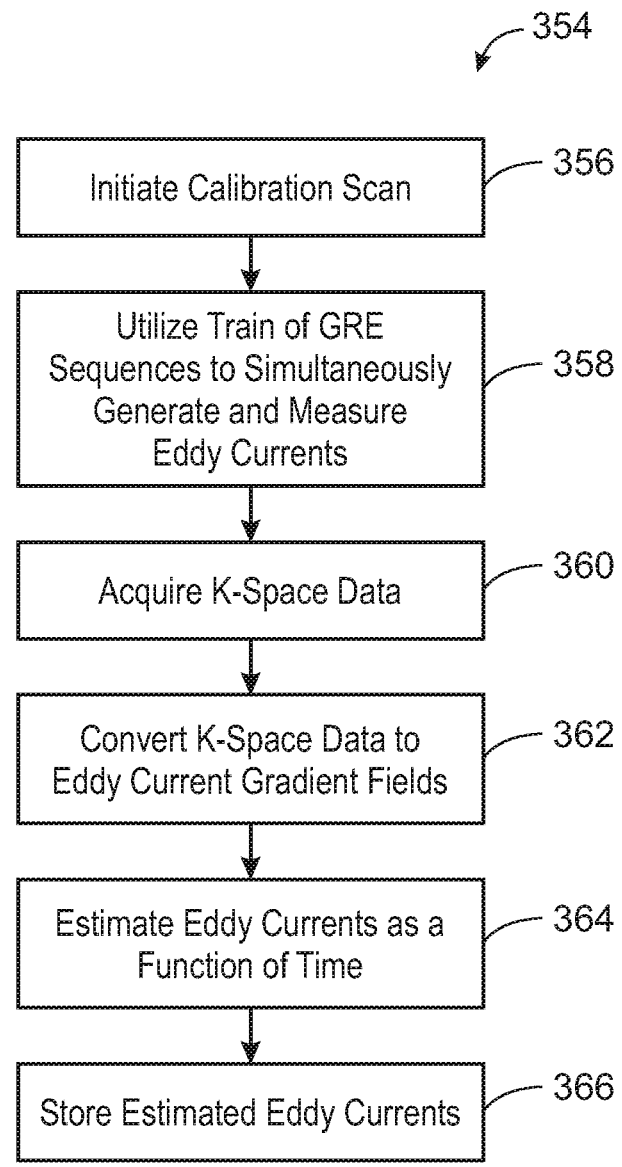
FIG. 5 illustrates a flow chart of a method for measuring eddy currents with long time constants, in accordance with aspects of the present disclosure.

FIG. 5 illustrates a flow chart of a method 354 for measuring eddy currents with long time constants. One or more steps of the method 354 may be performed by processing circuitry of the magnetic resonance imaging system 100 in FIG. 1. One or more of the steps of the method 354 may be performed simultaneously or in a different order from the order depicted in FIG. 5.

The method 354 includes initiating a calibration scan (e.g., eddy current calibration scan) of a phantom utilizing a magnetic resonance imaging scanner (e.g., MR scanner 102 in FIG. 1) of a magnetic resonance imaging system (block 356). The calibration scan may be performed during installation of MRI system and/or after maintenance on the MRI system.

The method 354 also includes utilizing a train of gradient echo (GRE) sequences to simultaneously generate and measure the eddy currents during the calibration scan (block 358). The train of gradient echo sequences includes gradient echo sequences that each include a first portion having a balanced gradient echo sequence (with zero gradient area) for eddy current measurement. The balanced gradient echo of each of these gradient echo sequences of the train have a balanced readout gradient and slice gradient to avoid eddy current effect from the readout gradient and the slice gradient. For example, gradient echo sequences 182 and 242 of FIGS. 2 and 3, respectively, each have balanced gradient echo sequences and may be utilized in the train of gradient echo sequences.

The train of gradient echo sequences also includes a first set of gradient echo sequences having a second portion having an eddy current excitation gradient or eddy current generating gradient having a positive polarity. For example, gradient echo sequence 182 of FIG. 2 has an eddy current excitation gradient or eddy current generating gradient having a positive polarity and may be utilized in the train of gradient echo sequences.

The train of gradient echo sequences also includes a second set of gradient echo sequences having a second portion having an eddy current excitation gradient or eddy current generating gradient having a negative polarity. For example, gradient echo sequence 242 of FIG. 3 has an eddy current excitation gradient or eddy current generating gradient having a negative polarity and may be utilized in the train of gradient echo sequences. The utilization of the first set of gradient echo sequences having a second portion having an eddy current excitation gradient or eddy current generating gradient having a positive polarity and the second set of gradient echo sequences having a second portion having an eddy current excitation gradient or eddy current generating gradient having a negative polarity form bipolar eddy current excitation gradients. These bipolar eddy current excitation gradients enable eddy currents to be distinguished from $B_0$ drift since eddy currents change direction in response to the bipolar eddy current excitation gradients and $B_0$ drift does not.

In conjunction with the train of GRE sequences, a GRE sequence having both a first portion having a balanced gradient echo sequence for eddy current measurement and a second portion lacking an eddy current excitation gradient or eddy current generating gradient may be utilized. For example, gradient echo sequence 302 in FIG. 4 may be utilized in conjunction with the train of GRE sequences. In particular, the gradient echo sequence 302 may be utilized prior to the train of gradient echo sequences to establish a baseline to remove background fields. In addition, the gradient echo sequence 302 may be utilized after the train of gradient echo sequences.

The gradient echo sequences utilized in train of gradient echo sequences (as well as the gradient echo sequence lacking an eddy current excitation gradient or eddy current generating gradient) are repeated at a regular rate as part of a pseudo-continuous scan (i.e., the eddy current calibration scan). In certain embodiments, the timing can be changed for repeating the gradient echo sequences as long as the pseudo-continuous condition is maintained and the average gradient area remains constant. In certain embodiments, these gradient echo sequences may be utilized in single pass to measure the eddy currents with long time constants. For example, the gradient echo sequence lacking an eddy current excitation gradient (e.g., gradient echo sequence 302) may first be repeated for a set number of times. Then, the gradient echo sequence having an eddy current excitation gradient with positive polarity (e.g., gradient echo sequence 182) is repeated for a set number of times, followed by repeating the gradient echo sequence having an eddy current excitation gradient with negative polarity (e.g., gradient echo sequence 242) a set number of times. Finally, the gradient echo sequence lacking an eddy current excitation gradient (e.g., gradient echo sequence 302) may then be repeated a set number of times. In certain embodiments, the respective set number of times that the gradient echo sequence having an eddy current excitation gradient with positive polarity and the gradient echo sequence having an eddy current excitation gradient with negative polarity are each repeated are the same. In certain embodiments, the respective set number of times that the gradient echo sequence having an eddy current excitation gradient with positive polarity and the gradient echo sequence having an eddy current excitation gradient with negative polarity are each repeated is greater than the set number of times that the gradient echo sequence lacking an eddy current excitation gradient is repeated. In certain embodiments, the set number of times the gradient echo sequence lacking the eddy current excitation gradient is repeated at the end of the pseudo-continuous scan is greater the set number of times the gradient echo sequence lacking the eddy current excitation gradient is repeated at the beginning of the pseudo-continuous scan. The set number of times for repeating each of the gradient echo sequences for a pseudo-continuous scan for simultaneously generating and measuring eddy currents with long time constants may vary.

In certain embodiments (also for a single pass), the order of the gradient echo sequences may vary. For example, the gradient echo sequence lacking an eddy current excitation gradient (e.g., gradient echo sequence 302) may first be repeated for a set number of times. Then, the gradient echo sequence having an eddy current excitation gradient with negative polarity (e.g., gradient echo sequence 242) is repeated for a set number of times, followed by repeating the gradient echo sequence having an eddy current excitation gradient with positive polarity (e.g., gradient echo sequence 182) a set number of times. Finally, the gradient echo sequence lacking an eddy current excitation gradient (e.g., gradient echo sequence 302) may then be repeated a set number of times. In certain embodiments, the respective set number of times that the gradient echo sequence having an eddy current excitation gradient with negative polarity and the gradient echo sequence having an eddy current excitation gradient with positive polarity are each repeated are the same. In certain embodiments, the respective set number of times that the gradient echo sequence having an eddy current excitation gradient with negative polarity and the gradient echo sequence having an eddy current excitation gradient with positive polarity are each repeated is greater than the set number of times that the gradient echo sequence lacking an eddy current excitation gradient is repeated. In certain embodiments, the set number of times the gradient echo sequence lacking the eddy current excitation gradient is repeated at the end of the pseudo-continuous scan is greater the set number of times the gradient echo sequence lacking the eddy current excitation gradient is repeated at the beginning of the pseudo-continuous scan. The set number of times for repeating each of the gradient echo sequences for a pseudo-continuous scan for simultaneously generating and measuring eddy currents with long time constants may vary.

In certain embodiments, multiple passes (e.g., two passes) may be utilized for measuring eddy currents with long time constants. In a first pass, the gradient echo sequence lacking an eddy current excitation gradient (e.g., gradient echo sequence 302) may first be repeated for a set number of times. Then, the gradient echo sequence having an eddy current excitation gradient with positive polarity (e.g., gradient echo sequence 182) is repeated for a set number of times. Finally, the gradient echo sequence lacking an eddy current excitation gradient (e.g., gradient echo sequence 302) may then be repeated a set number of times. In a second pass, the gradient echo sequence lacking an eddy current excitation gradient (e.g., gradient echo sequence 302) may first be repeated for a set number of times. Then, the gradient echo sequence having an eddy current excitation gradient with negative polarity (e.g., gradient echo sequence 242) is repeated for a set number of times. Finally, the gradient echo sequence lacking an eddy current excitation gradient (e.g., gradient echo sequence 302) may then be repeated a set number of times. In certain embodiments, the respective set number of times that the gradient echo sequence having an eddy current excitation gradient with positive polarity and the gradient echo sequence having an eddy current excitation gradient with negative polarity are each repeated are the same. In certain embodiments, the gradient echo sequence having an eddy current excitation gradient with negative polarity may be utilized in the first pass and the gradient echo sequence having an eddy current excitation gradient with positive polarity may be utilized in the second pass.

Notwithstanding the prior reference to using a set number of repetitions of the gradient echo sequence, in certain embodiments the number of times for repeating of each gradient echo sequences may be adaptively varied during a test session in response to the analysis of the prior acquired gradient echo sequences.

Returning to FIG. 5, the method 354 further includes acquiring k-space data from the train of gradient echo sequences (as well as the gradient echo sequences lacking an eddy current excitation gradient) (block 360). The method 354 even further includes converting the k-space data to eddy current gradient fields (block 362). Converting the k-space data to eddy current gradient fields may include a number of steps. In certain embodiments, each line of k-space data may be subjected to one-dimensional Fourier transformation to generate complex data. Phase information may be obtained from the complex data and the phase information along with linear regression may be utilized to obtain a slope and intercept to determine the eddy current gradient fields. The slope provides the spatially linear term of the eddy current. The intercept provides the spatially independent $B_0$ term.

The method 354 yet further includes estimating the eddy currents as a function of time based on the eddy current gradient fields (block 364). The induced eddy current can be approximated as resulting from a constant gradient with a duration equal to the time repetition and an amplitude equivalent to an average gradient, wherein the average gradient is a total gradient area of a respective gradient echo sequence of the train of gradient echo sequences divided by the time repetition. In certain embodiments, estimating the eddy currents as a function of time includes scaling the eddy current gradient fields by an average gradient strength and fitting the scaled eddy current gradient fields as a function of time. In particular, estimating the eddy currents as a function of time ($G_{ec}(t)$) involves utilizing the following equation:

$$G_{ec}(t) = G_{ave} * \alpha * (1 - e^{-t/TC}), \qquad (1)$$

wherein $G_{ave}$ is an average gradient, $\alpha$ is an eddy current amplitude in percentage, t is time, and TC is a time constant of a respective eddy current. As noted above, the average gradient, $G_{ave}$, is the total gradient area divided by the time repetition of the gradient echo sequence. The average gradient is determined by the gradient echo sequence. The eddy current amplitude in percentage, $\alpha$, is unknown. The time constant is also unknown. The method 354 enables the measurement of the time constant and the amplitude accurately when the sequence time repetition is much shorter than the time constant (i.e., the time constant is at least two times the time repetition).

The method 354 even further includes storing the estimated eddy currents (block 366). The estimated eddy currents may be utilized for correcting acquired MR scan data.

As noted above, the method 354 in FIG. 5 enables the measurement of the time constant and the amplitude of Equation 1 accurately when the sequence time repetition is much shorter than the time constant (i.e., the time constant is at least two times the time repetition). This is demonstrated in FIGS. 6-9 which are graphs illustrating measured eddy current values fitted as a function of time utilizing the techniques described herein at various eddy current time constants as part of a test procedure. It should be noted that FIGS. 6-9 is part of a test to prove that the method 354 in FIG. 5 works. Injected eddy current tests are not part of the normal operation of the method 354.

The test procedure includes dialing in the linear eddy current along the frequency direction at amplitude (a) of −1.0% and varying time constants (e.g., 0.01 seconds, 0.1 seconds, 1 second, and 10 seconds). The eddy currents are measured utilizing the method 354 described in FIG. 5. The gradient echo sequence utilized (e.g., as described in FIGS. 2-4) has a time repetition of 100 ms. The eddy current excitation gradient (for the positive polarity and the negative polarity) is applied along the frequency direction only. The average gradient strength is 1.5 G/cm. The full scan includes a sequence of 10 repetitions of a gradient echo sequence lacking an eddy current excitation gradient (e.g., gradient echo sequence 302 in FIG. 4), followed in order by 200 repetitions of a gradient echo sequence having an eddy current excitation gradient with positive polarity (e.g., gradient echo sequence 182 in FIG. 2), 200 repetitions of a gradient echo sequence having an eddy current excitation gradient with negative polarity (e.g., gradient echo sequence 242 in FIG. 3), another 200 repetitions of the gradient echo sequence having an eddy current excitation gradient with positive polarity (e.g., gradient echo sequence 182 in FIG. 2), another 200 repetitions of the gradient echo sequence having an eddy current excitation gradient with negative polarity (e.g., gradient echo sequence 242 in FIG. 3), and finally 214 repetitions of the gradient echo sequence lacking an eddy current excitation gradient (e.g., gradient echo sequence 302 in FIG. 4).

In the test procedure, the first 10 repetitions of the gradient echo sequence lacking an eddy current excitation gradient (e.g., gradient echo sequence 302 in FIG. 4) are treated as baseline. Also, the first repetition with the gradient echo sequence having an eddy current excitation gradient with positive polarity (e.g., gradient echo sequence 182 in FIG. 2) is set at time equaling 0 seconds. The measured raw data is then converted to eddy current gradient fields as described utilizing the method 354 in FIG. 5. The calculated eddy current gradient is then scaled by the average gradient strength and fit as a function of time utilizing Equation 1 described above. This is done for each of the different eddy current time constants.

Figure 6:
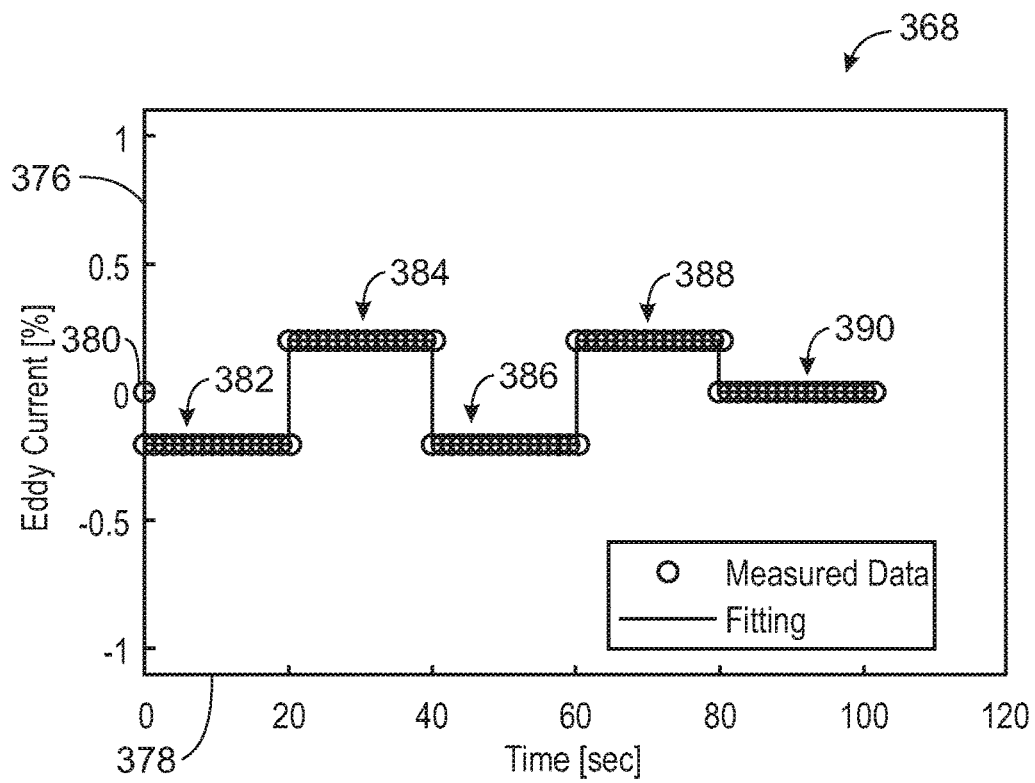
FIG. 6 is a graph illustrating measured eddy current values fitted as a function of time utilizing the techniques described herein (e.g., with an eddy current time constant of 0.01 seconds and an amplitude −0.1%) as part of a test procedure, in accordance with aspects of the present disclosure.
Figure 7:
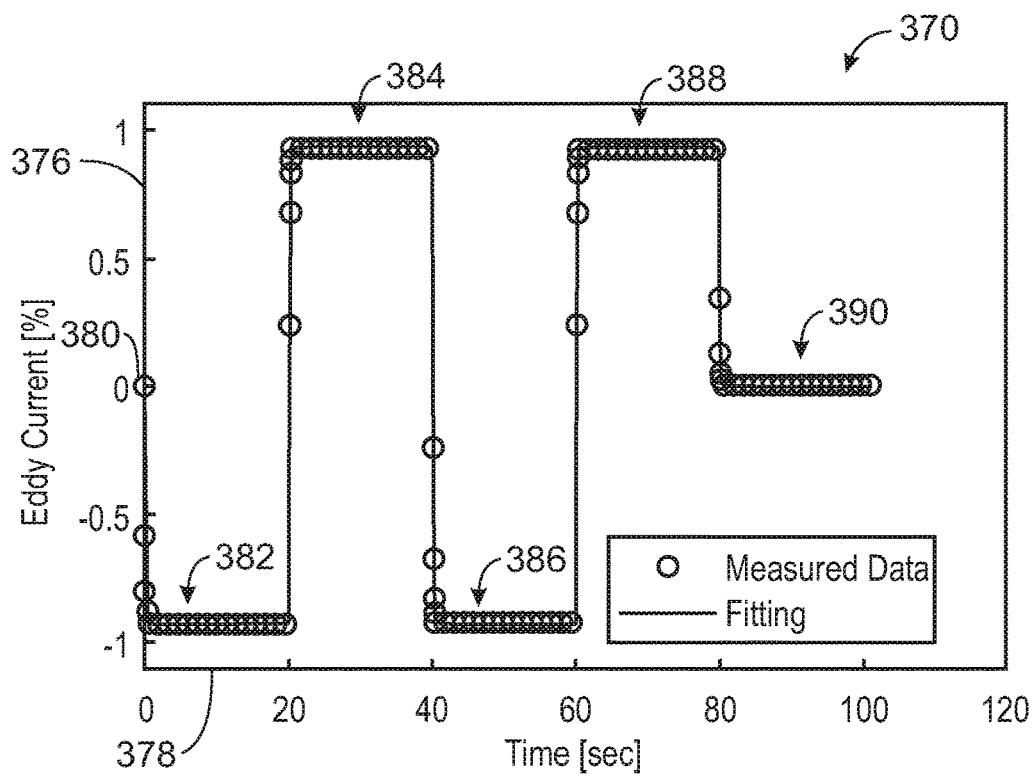
FIG. 7 is a graph illustrating measured eddy current values fitted as a function of time utilizing the techniques described herein (e.g., with an eddy current time constant of 0.1 seconds and an amplitude −0.1%) as part of a test procedure, in accordance with aspects of the present disclosure.
Figure 8:
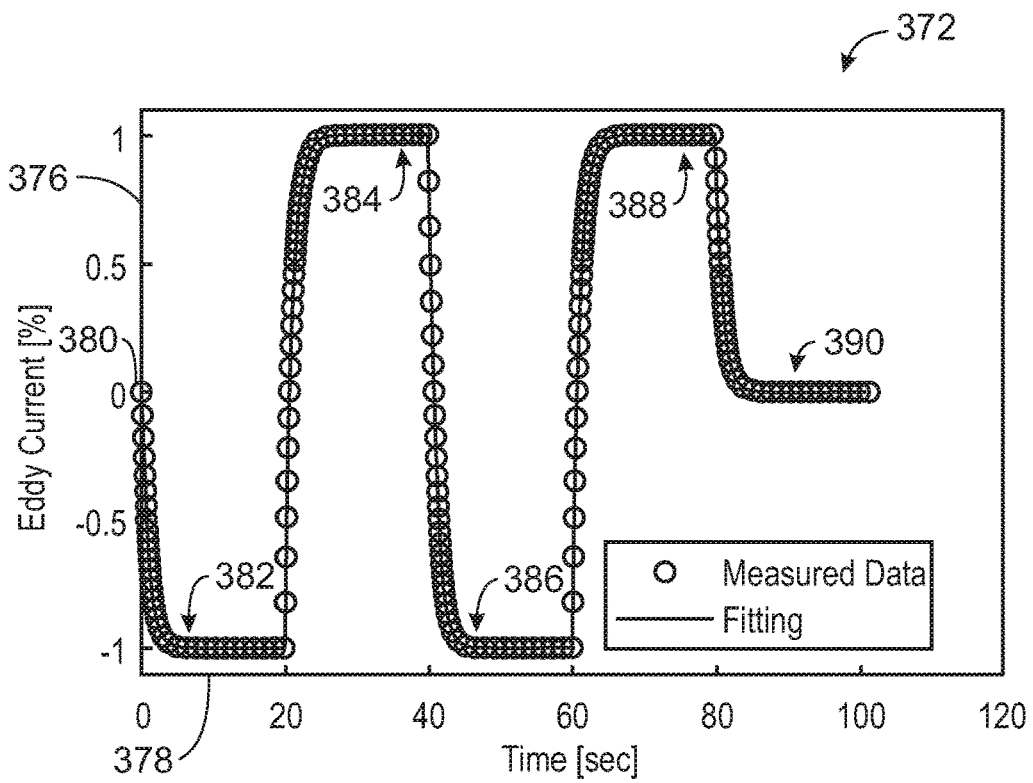
FIG. 8 is a graph illustrating measured eddy current values fitted as a function of time utilizing the techniques described herein (e.g., with an eddy current time constant of 1.0 second and an amplitude −0.1%) as part of a test procedure, in accordance with aspects of the present disclosure.
Figure 9:
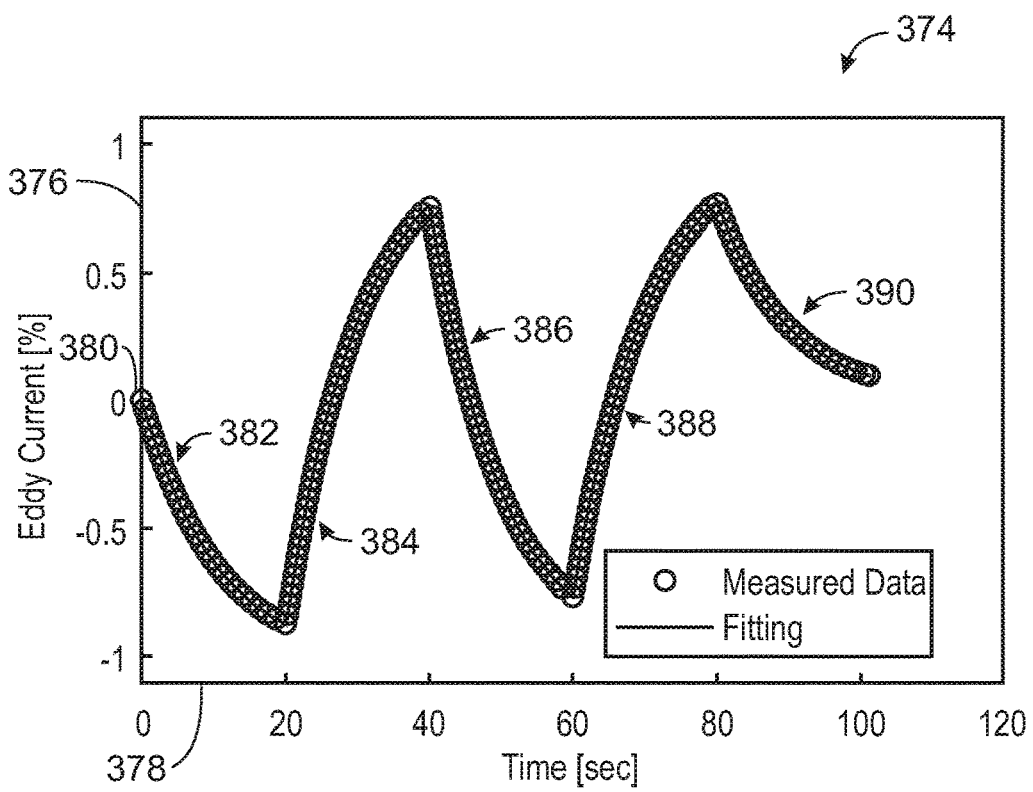
FIG. 9 is a graph illustrating measured eddy current values fitted as a function of time utilizing the techniques described herein (e.g., with an eddy current time constant of 10 seconds and an amplitude −0.1%) as part of a test procedure, in accordance with aspects of the present disclosure.

FIG. 6 is a graph 368 illustrating measured eddy current values fitted as a function of time utilizing the techniques described herein (e.g., with an eddy current time constant of 0.01 seconds) as part of the test procedure. FIG. 7 is a graph 370 illustrating measured eddy current values fitted as a function of time utilizing the techniques described herein (e.g., with an eddy current time constant of 0.1 seconds) as part of the test procedure. FIG. 8 is a graph 372 illustrating measured eddy current values fitted as a function of time utilizing the techniques described herein (e.g., with an eddy current time constant of 1 second) as part of the test procedure. FIG. 9 is a graph 374 illustrating measured eddy current values fitted as a function of time utilizing the techniques described herein (e.g., with an eddy current time constant of 10 seconds) as part of the test procedure. Each of the graphs 368, 370, 372, 374 has a Y-axis 376 representing the eddy current gradient (in percentage) and an X-axis 378 representing time (in seconds (sec)). Point 380 in each of the graphs 368, 370, 372, 374 represents the first data point at time=0 (the impact of baseline has been removed by subtracting the average of eddy current gradient fields from the 10 repetitions of the gradient echo sequence lacking the eddy current excitation gradient). Section 382 in each of the graphs 368, 370, 372, 374 represents the data from the first 200 repetitions of the gradient echo sequence having the eddy current excitation gradient with a positive polarity. Section 384 in each of the graphs 368, 370, 372, 374 represents the data from the first 200 repetitions of the gradient echo sequence having the eddy current excitation gradient with a negative polarity. Section 386 in each of the graphs 368, 370, 372, 374 represents the data from the second 200 repetitions of the gradient echo sequence having the eddy current excitation gradient with a positive polarity. Section 388 in each of the graphs 368, 370, 372, 374 represents the data from the second 200 repetitions of the gradient echo sequence having the eddy current excitation gradient with a negative polarity. Section 390 in each of the graphs 368, 370, 372, 374 represents the data from the last 214 repetitions of the gradient echo sequence lacking the eddy current excitation gradient. In each of the graphs 368, 370, 372, 374, the open circles represent the measured data and the line the fitting of the measured data.

With respect to the data in the graph 368, the ground truth for the time constant was 0.01 seconds and the ground truth for amplitude ($\alpha$) was −1.0% while the fitted result for the measured time constant was 0.017 seconds and the fitted result for amplitude ($\alpha$) was −0.20%. With respect to the data in the graph 370, the ground truth for the time constant was 0.1 seconds and the ground truth for amplitude ($\alpha$) was −1.0% while the fitted result for the measured time constant was 0.10 seconds and the fitted result for amplitude ($\alpha$) was −0.93%. With respect to the data in the graph 372, the ground truth for the time constant was 1 second and the ground truth for amplitude ($\alpha$) was −1.0% while the fitted result for the measured time constant was 1.01 seconds and the fitted result for amplitude ($\alpha$) was −1.00%. With respect to the data in the graph 374, the ground truth for the time constant was 10 seconds and the ground truth for amplitude ($\alpha$) was −1.0% while the fitted result for the measured time constant was 10.12 seconds and the fitted result for amplitude ($\alpha$) was −1.01%. The data in the graphs 372, 374 illustrates that the described method 354 in FIG. 5 can measure the time constant and the amplitude accurately when the time repetition of the gradient echo sequence is much shorter than the time constant (i.e., the time constant is at least 2 times the time repetition of the gradient echo sequence). The data in the graphs 368, 370 illustrates that when the time repetition of gradient echo sequence is comparable with or shorter than the time constant, the eddy current cannot be quantified accurately by the method 354 described in FIG. 5 because the average gradient assumption requires that the time repetition of the gradient echo sequence be much shorter than the time constant. Thus, the method 354 described in FIG. 5 can be utilized to measure eddy currents with long time constants.

Figure 10:
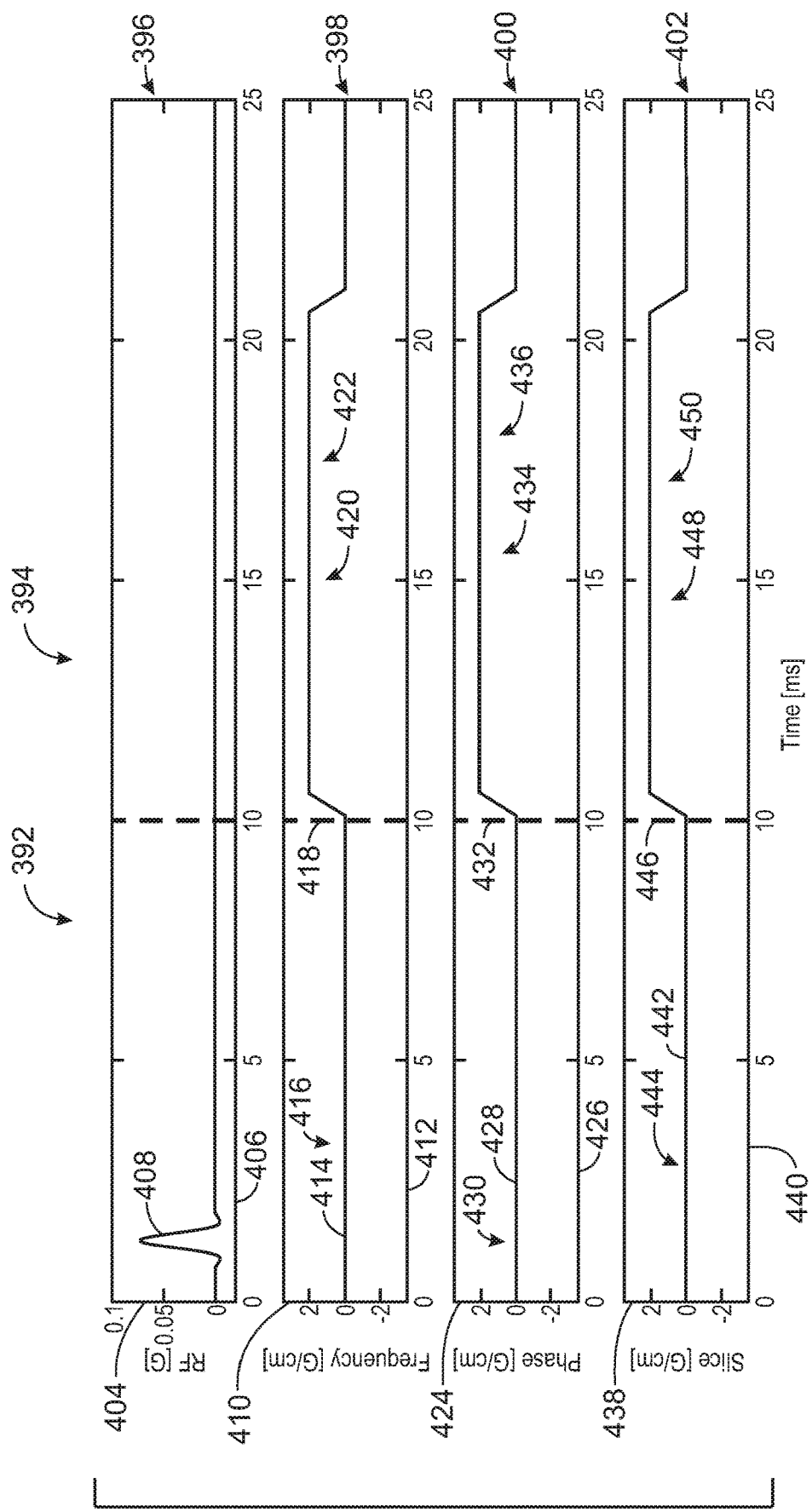
FIG. 10 illustrates a pulse sequence diagram for a free induction decay sequence utilized to measure eddy currents with long time constants (e.g., having eddy current excitation gradients with positive polarity), in accordance with aspects of the present disclosure.

In certain embodiments, instead of a gradient echo sequence, a free induction decay sequence may be utilized for data collection in measuring eddy currents with long time constants. FIG. 10 illustrates a pulse sequence diagram 392 for a free induction decay sequence 394 utilized to measure eddy currents with long time constants (e.g., having eddy current excitation gradients with positive polarity). It should be noted that small localized samples (e.g., six samples with two samples each aligned along X, Y, and Z axes to localize the field measurements) having transmit and receiving coils (e.g., as part of a GRAFIDY tool kit) are utilized instead of a large phantom when free induction decay sequences are utilized in measuring eddy currents with long time constants.

The four rows 396, 398, 400, and 402 illustrate the free induction decay sequence 394 utilized to measure eddy currents with long time constants. The first row 396 (e.g. top row) of the pulse sequence diagram 392 illustrates RF (represented along Y-axis 404) over time (represented along X-axis 406). As depicted, an RF pulse 408 is generated at approximately 1 millisecond. The second row 398 of the pulse sequence diagram 392 illustrates a gradient (represented along Y-axis 410 as gradient strength) applied along a frequency direction over time (represented along X-axis 412). The gradient applied along the frequency direction is represented by plot 414. A first portion 416 of the plot 414 located to the left of dashed line 418 is a free induction decay having a zero gradient area. A second portion 420 of the plot 414 located to the right of the dashed line 418 has an eddy current excitation gradient or eddy current generating gradient 422 having a positive polarity.

The third row 400 of the pulse sequence diagram 392 illustrates a gradient (represented along Y-axis 424 as gradient strength) applied along a phase direction over time (represented along X-axis 426). The gradient applied along the phase direction is represented by plot 428. A first portion 430 of the plot 428 located to the left of dashed line 432 is a free induction decay having a zero gradient area. A second portion 434 of the plot 428 located to the right of the dashed line 432 has an eddy current excitation gradient or eddy current generating gradient 436 having a positive polarity.

The fourth row 402 (e.g., bottom row) of the pulse sequence diagram 392 illustrates a gradient (represented along Y-axis 438 as gradient strength) applied along a slice direction over time (represented along X-axis 440). The gradient applied along the slice direction is represented by plot 442. A first portion 444 of the plot 442 located to the left of dashed line 446 is a free induction decay having a zero gradient area. A second portion 450 of the plot 442 located to the right of the dashed line 446 has an eddy current excitation gradient or eddy current generating gradient 448 having a positive polarity.

The free induction decay of the first portions 416, 430, 444 of the applied gradients are utilized for eddy current measurement. The first portions 204 and 232 of the frequency gradient (e.g., readout gradient) and the slice gradient, respectively, are balanced to avoid eddy current effects from the frequency gradient and the slice gradient. The eddy current excitation gradients 422, 436, and 448 of the second portions 420, 434, and 450 are utilized for eddy current generation. The eddy current excitation gradients 422, 436, and 450 having positive polarity are utilized in conjunction with a free induction decay sequence that includes eddy current excitation gradients having a negative polarity to form bipolar eddy current excitation gradients. These bipolar eddy current excitation gradients enable eddy currents to be distinguished from $B_0$ drift since eddy currents change direction in response to the bipolar eddy current excitation gradients and $B_0$ drift does not. The free induction decay sequence 394 is utilized in conjunction with a free induction decay sequence (to form a train of free induction decay sequences that are intermittently repeated (e.g., every 100 milliseconds (ms)) (e.g., as part of a pseudo-continuous scan) to measure eddy currents. The train of free induction decay sequences are utilized in conjunction with a free induction decay sequence lacking eddy current excitation gradients.

Technical effects of the disclosed subject matter include enabling measurement of eddy currents with long time constants utilizing a gradient echo sequence. Technical effects of the disclosed subject matter also include enabling the simultaneous generation and measurement eddy currents. This enables a pseudo-continuous scan (with the train of GRE sequences intermittently repeated) to be utilized to measure eddy currents with long time constants that takes less time and is more efficient than previous techniques. In addition, the disclosed subject matter is less sensitive to $B_0$ drift. Technical effects of the disclosed subject matter further include improving the accuracy of calibration for eddy currents with very long time constants. By increasing the accuracy of the calibration, image quality is improved in certain MR images.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for measuring eddy currents with long time constants, comprising:
  initiating, via a processor, a calibration scan of a phantom utilizing a magnetic resonance imaging (MRI) scanner;
  utilizing, via the processor, a train of gradient echo sequences to simultaneously generate and measure the eddy currents during the calibration scan, wherein both eddy current generation and measurement are completed within each gradient echo sequence of the train of gradient echo sequences;
  acquiring, via the processor, k-space data from the train of gradient echo sequences;
  converting, via the processor, the k-space data to eddy current gradient fields; and
  estimating, via the processor, the eddy currents as a function of time based on the eddy current gradient fields.

2. The computer-implemented method of claim 1, wherein a first portion of each gradient echo sequence of the train of gradient echo sequences comprises a balanced gradient echo for eddy current measurement, wherein the balanced gradient echo has a balanced readout gradient and slice gradient to avoid eddy current effect.

3. The computer-implemented method of claim 2, wherein a second portion of a set of gradient echo sequences of the train of gradient echo sequences comprises an eddy current excitation gradient for eddy current generation.

4. The computer-implemented method of claim 3, wherein the second portion of some gradient echo sequences of the set of gradient echo sequences comprises a negative eddy current excitation gradient and the second portion of some gradient echo sequences of the set of gradient echo sequences comprises a positive eddy current excitation gradient.

5. The computer-implemented method of claim 1, wherein the estimated eddy currents have a time constant at least two times longer than a time repetition of each gradient echo sequence of the train of gradient echo sequences.

6. The computer-implemented method of claim 5, wherein the induced eddy current can be approximated as resulting from a constant gradient with a duration equal to the time repetition and an amplitude equivalent to an average gradient, wherein the average gradient is a total gradient area of a respective gradient echo sequence of the train of gradient echo sequences divided by the time repetition.

7. The computer-implemented method of claim 5, wherein estimating the eddy currents as a function of time comprises scaling the eddy current gradient fields by an average gradient strength and fitting the scaled eddy current gradient fields as a function of time.

8. The computer-implemented method of claim 5, wherein estimating the eddy currents as a function of time ($G_{ec}(t)$) comprises utilizing the following equation:

$$G_{ec}(t) = G_{ave} * \alpha * (1 - e^{-t/TC}),$$

wherein $G_{ave}$ is an average gradient, $\alpha$ is an eddy current amplitude in percentage, t is time, and TC is a time constant of a respective eddy current.

9. A system for measuring eddy currents with long time constants, comprising:
a memory encoding processor-executable routines; and
a processor configured to access the memory and to execute the processor-executable routines, wherein the processor-executable routines, when executed by the processor, cause the processor to:
initiate a calibration scan of a phantom utilizing a magnetic resonance imaging (MRI) scanner;
utilize a train of gradient echo sequences to simultaneously generate and measure the eddy currents during the calibration scan, wherein both eddy current generation and measurement are completed within each gradient echo sequence of the train of gradient echo sequences;
acquire k-space data from the train of gradient echo sequences;
convert the k-space data to eddy current gradient fields; and
estimate the eddy currents as a function of time based on the eddy current gradient fields.

10. The system of claim 9, wherein a first portion of each gradient echo sequence of the train of gradient echo sequences comprises a balanced gradient echo for eddy current measurement, wherein the balanced gradient echo has a balanced readout gradient and slice gradient to avoid eddy current effect.

11. The system of claim 10, wherein a second portion of a set of gradient echo sequences of the train of gradient echo sequences comprises an eddy current excitation gradient for eddy current generation.

12. The system of claim 11, wherein the second portion of some gradient echo sequences of the set of gradient echo sequences comprises a negative eddy current excitation gradient and the second portion of some gradient echo sequences of the set of gradient echo sequences comprises a positive eddy current excitation gradient.

13. The system of claim 9, wherein the estimated eddy currents have a time constant at least two times longer than a time repetition of each gradient echo sequence of the train of gradient echo sequences.

14. The system of claim 13, wherein the induced eddy current can be approximated as resulting from a constant gradient with a duration equal to the time repetition and an amplitude equivalent to an average gradient, wherein the average gradient is a total gradient area of a respective gradient echo sequence of the train of gradient echo sequences divided by the time repetition.

15. The system of claim 13, wherein estimating the eddy currents as a function of time comprises scaling the eddy current gradient fields by an average gradient strength and fitting the scaled eddy current gradient fields as a function of time.

16. The system of claim 13, wherein estimating the eddy currents as a function of time ($G_{ec}(t)$) comprises utilizing the following equation:

$$G_{ec}(t) = G_{ave} * \alpha * (1 - e^{-t/TC}),$$

wherein $G_{ave}$ is an average gradient, $\alpha$ is an eddy current amplitude in percentage, t is time, and TC is a time constant of a respective eddy current.

17. A non-transitory computer-readable medium, the non-transitory computer-readable medium comprising processor-executable code that when executed by a processor, causes the processor to:
initiate a calibration scan of a phantom utilizing a magnetic resonance imaging (MRI) scanner;
utilize a train of gradient echo sequences to simultaneously generate and measure eddy currents during the calibration scan, wherein both eddy current generation and measurement are completed within each gradient echo sequence of the train of gradient echo sequences;
acquire k-space data from the train of gradient echo sequences;
convert the k-space data to eddy current gradient fields; and
estimate the eddy currents as a function of time based on the eddy current gradient fields.

18. The non-transitory computer-readable medium of claim 17, wherein the estimated eddy currents have a time constant at least two times longer than a time repetition of each gradient echo sequence of the train of gradient echo sequences.

19. The non-transitory computer-readable medium of claim 18, wherein estimating the eddy currents as a function of time comprises scaling the eddy current gradient fields by an average gradient strength and fitting the scaled eddy current gradient fields as a function of time.

20. The non-transitory computer-readable medium of claim 18, wherein estimating the eddy currents as a function of time ($G_{ec}(t)$) comprises utilizing the following equation:

$$G_{ec}(t) = G_{ave} * \alpha * \left(1 - e^{-t/TC}\right),$$

wherein $G_{ave}$ is an average gradient, $\alpha$ is an eddy current amplitude in percentage, t is time, and TC is a time constant of a respective eddy current.

\* \* \* \* \*